(12) United States Patent
Naru et al.

(10) Patent No.: US 10,541,700 B2
(45) Date of Patent: Jan. 21, 2020

(54) GAIN AND MEMORY ERROR ESTIMATION IN A PIPELINE ANALOG TO DIGITAL CONVERTER

(71) Applicant: Texas Instruments Incorporated, Dallas, TX (US)

(72) Inventors: Srinivas Kumar Reddy Naru, Markapur (IN); Narasimhan Rajagopal, Chennai (IN); Shagun Dusad, Bangalore (IN); Viswanathan Nagarajan, Bangalore (IN); Visvesvaraya Appala Pentakota, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/249,225

(22) Filed: Jan. 16, 2019

(65) Prior Publication Data
US 2019/0280703 A1 Sep. 12, 2019

(30) Foreign Application Priority Data

Mar. 12, 2018 (IN) .............................. 201841009007

(51) Int. Cl.
*H03M 1/06* (2006.01)
*H03M 1/04* (2006.01)
*H03M 1/16* (2006.01)

(52) U.S. Cl.
CPC .......... *H03M 1/0604* (2013.01); *H03M 1/04* (2013.01); *H03M 1/164* (2013.01)

(58) Field of Classification Search
None
See application file for complete search history.

(56) References Cited

U.S. PATENT DOCUMENTS

| | | | |
|---|---|---|---|
| 2013/0015988 A1* | 1/2013 | Verbruggen | H03M 1/04 341/110 |
| 2014/0184194 A1* | 7/2014 | Yamaguchi | G01R 29/00 324/76.11 |

OTHER PUBLICATIONS

Weaver et al., Stochastic Flash Analog-to-Digital Conversion, IEEE Transactions on Circuits and Systems—I: Regular Papers, vol. 57, No. 11, Nov. 2010 (Year: 2010).*
Goren et al., A Novel Method for Stochastic Nonlinearity Analysis of a CMOS Pipeline ADC, Jun. 2001 DAC '01: Proceedings of the 38th annual Design Automation Conference Publisher: Association of Computing Machinery (ACM) (Year: 2001).*

* cited by examiner

*Primary Examiner* — Howard Williams
(74) *Attorney, Agent, or Firm* — John R. Pessetto; Charles A. Brill; Frank D. Cimino

(57) ABSTRACT

In described examples, a stochastic comparator includes a first comparator that compares an input signal and a primary threshold to generate a first signal. A second comparator compares the input signal and the primary threshold to generate a second signal. A decision block generates a control signal in response to the first signal, the second signal and a PRBS (pseudo random binary sequence) signal. A XOR gate generates a detection signal in response the first signal and the second signal.

20 Claims, 4 Drawing Sheets

GAIN AND MEMORY ERROR ESTIMATION IN A PIPELINE ANALOG TO DIGITAL CONVERTER

CROSS REFERENCES TO RELATED APPLICATIONS

This application claims priority from India provisional patent application No. 201841009007 filed on Mar. 12, 2018 which is hereby incorporated by reference in its entirety.

TECHNICAL FIELD

The present disclosure is generally related to an analog front end (AFE) circuit, and more particularly to memory and gain error estimation in a pipeline analog to digital converter (ADC) in the AFE circuit.

BACKGROUND

Analog systems and digital systems are commonly implemented in an integrated circuit using system on-chip (SOC) technology. Such systems commonly include an analog front end (AFE) circuit. The AFE circuit operates as an interface between an external input terminal, through which analog signals are input, and a digital signal processing unit that processes the received signals in digital format.

The AFE circuit is widely used in various devices, such as down converters for wireless digital communication devices, digital image scanners, digital cameras and voice codecs, and the like. The AFE circuit includes an analog to digital converter (ADC). The ADC converts an analog input signal into a digital signal. An amplifier used in the ADC for amplifying has gain error. This introduces spurs and results in degradation in performance of the ADC.

Also, the amplifier is one of the most power consuming device in the ADC. In high speed operation, the amplifier can also have memory which is the charge stored with respect to inputs in previous cycles. This hinders generation of an accurate digital output by the ADC.

SUMMARY

In described examples, a stochastic comparator includes a first comparator that compares an input signal and a primary threshold to generate a first signal. A second comparator compares the input signal and the primary threshold to generate a second signal. A decision block generates a control signal in response to the first signal, the second signal and a PRBS (pseudo random binary sequence) signal. A XOR gate generates a detection signal in response the first signal and the second signal.

BRIEF DESCRIPTION OF THE VIEWS OF DRAWINGS

DETAILED DESCRIPTION OF THE EMBODIMENTS

Figure 1:
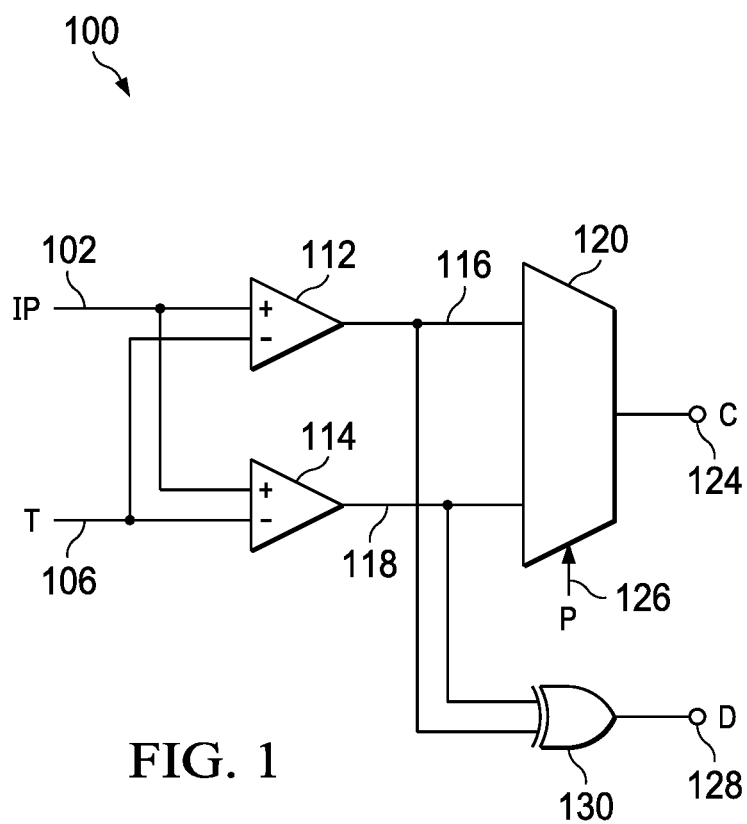
FIG. 1 is a block diagram illustrating a stochastic comparator, according to an embodiment.

FIG. 1 is a block diagram illustrating a stochastic comparator 100, according to an embodiment. The stochastic comparator 100 includes a first comparator 112, a second comparator 114, a decision block 120 and a XOR gate 130. Each of the first comparator 112 and the second comparator 114 receive an input signal IP 102 and a primary threshold T 106. The decision block 120 is coupled to the first comparator 112 and the second comparator 114.

The decision block 120 receives a PRBS (pseudo random binary sequence) signal (P) 126. In one example, the PRBS signal P 126 is a random sequence of binary bits. In another example, the PRBS signal P 126 is a known sequence of binary bits. In yet another example, the PRBS signal P 126 is an alternate sequence of 1's and 0's. The XOR gate 130 is coupled to the first comparator 112 and the second comparator 114. The stochastic comparator 100 may include one or more additional components known to those skilled in the relevant art and are not discussed here for simplicity of the description.

The operation of the stochastic comparator 100 illustrated in FIG. 1 is explained now. The first comparator 112 compares the input signal IP 102 and the primary threshold T 106 to generate a first signal 116. The second comparator 114 compares the input signal IP 102 and the primary threshold T 106 to generate a second signal 118. The decision block 120 generates a control signal C 124 in response to the first signal 116, the second signal 118 and the PRBS signal P 126. The XOR gate 130 generates a detection signal D 128 in response to the first signal 116 and the second signal 118.

In one example, the PRBS signal P 126 is generated from the detection signal D 128 through a toggle flip-flop instead of using a linear feedback shift register (LFSR). The detection signal D 128 which is an output of the XOR gate 130 is provided as a toggle input to the toggle flip-flop. The toggle flip-flop flips its output whenever its toggle is logic high or '1'. The detection signal D 128 being at logic high or '1' is a random event which assist in generating the PRBS signal P 126. This also helps in faster loop convergence since the loop receives equal 0's and 1's every alternate sample.

When the first signal 116 and the second signal 118 are equal, the control signal C 124 is equal to one of the first signal 116 and the second signal 118. When the first signal 116 is 0 and the second signal 118 is 1 or vice-versa, the control signal C 124 is equal to the first signal 116 when the PRBS signal P 126 is equal to an ancillary bit, and the control signal C 124 is equal to the second signal 118 when the PRBS signal P 126 is equal to an inverse ancillary bit. A random mismatch between the first comparator 112 and the second comparator 114 and the thermal noise of these comparators results in non-equality of the first signal 116 and the second signal 118, when the input signal IP 102 is equal to or close to the primary threshold T 106. The PRBS signal P 126 affects the control signal C 124 only when the first signal 116 is not equal to the second signal 118.

In one example, ancillary bit is 0 and the inverse ancillary bit is 1. Thus, when the first signal 116 and the second signal 118 are equal, the control signal C 124 is equal to one of the first signal 116 and the second signal 118. When the first signal 116 is 0 and the second signal 118 is 1 or vice-versa, then the control signal C 124 is equal to the first signal 116 when the PRBS signal P 126 is equal to 0, and the control signal C 124 is equal to the second signal 118 when the PRBS signal P 126 is equal to 1. The detection signal D 128 is at logic high or logic 1 when the first signal 116 is not equal to the second signal 118.

The input signal IP 102 includes a positive input signal and a negative input signal. The positive input signal is above a defined threshold and the negative input signal is below the defined threshold. In one example, when the input signal IP 102 is a sine wave and the defined threshold is 0 volt, then the sine wave above 0 volt is a positive input signal and the sine wave below 0 volt is a negative input signal. The decision block 120 operates in the same manner as discussed above both for the positive input signal and the negative input signal.

The use of two comparators, the first comparator 112 and the second comparator 114, using the same primary threshold T 106 allows for indirect injection of a known signal, which provides an improved estimation of non-idealities associated with blocks following the first comparator 112 and the second comparator 114. In one example, when the input signal IP 102 is equal to or close to the primary threshold T 106, the control signal C 124 is equiprobable between the first signal 116 and the second signal 118. Hence, when the detection signal D 128, which is the output of the XOR gate 130, is equal to 1, the control signal C 124 acts as the known signal toggling between the ancillary bit and the inverse ancillary bit.

Figure 2:
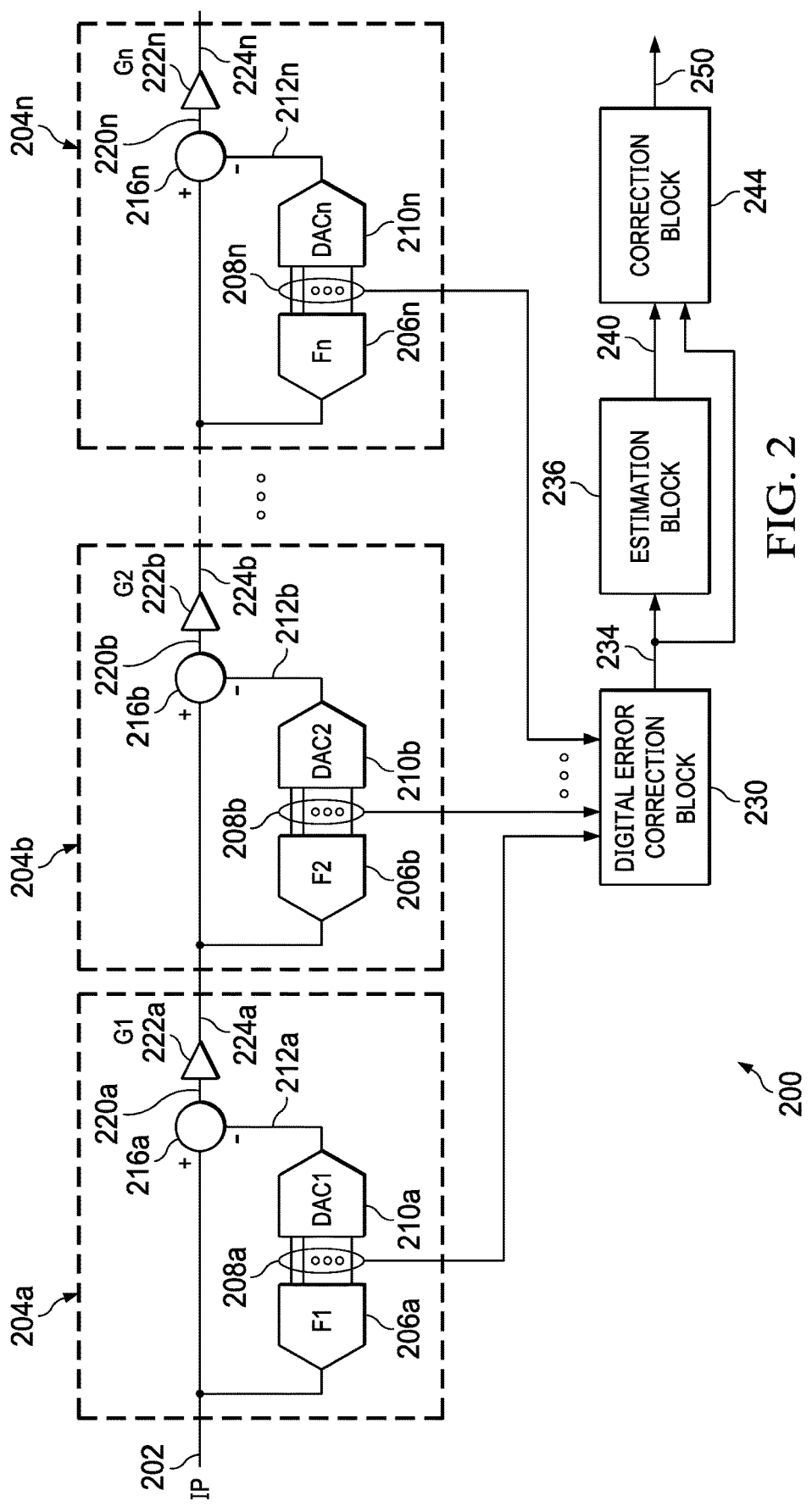
FIG. 2 illustrates a pipeline ADC (analog to digital converter), according to an embodiment.

FIG. 2 illustrates a pipeline ADC (analog to digital converter) 200, according to an embodiment. The pipeline ADC 200 includes multiple stages illustrated as 204*a*, 204*b* to 204*n*. Each stage includes multiple components including, but not limited to, a flash ADC for example F1 206*a*, F2 206*b* and Fn 206*n*, a DAC (digital to analog converter) for example the DAC1 210*a*, DAC2 210*b* and DACn 210*n*. Each stage also includes a subtractor coupled to the DAC for example DAC1 210*a* is coupled to a subtractor 216*a*, and DACn 210*n* is coupled to the subtractor 216*n*. A gain amplifier is part of each stage for example G1 222*a*, G2 222*b* to Gn 222*n*.

For brevity of description, connection of stage 204*a* is explained here, and it is understood that other stages have similar connections. The flash ADC F1 206*a* in the stage 204*a* receives an input signal IP 202. The DAC1 210*a* is coupled to the flash ADC F1 206*a*. The subtractor 216*a* is coupled to the DAC1 210*a* and receives the input signal IP 202. The gain amplifier G1 222*a* is coupled to the subtractor 216*a*. The stage 204*b* is coupled to the gain amplifier G1 222*a*.

The pipeline ADC 200 also includes a digital error correction block 230, an estimator block 236 and a corrector block 244. The digital error correction block 230 is coupled to the flash ADC of each stage for example the digital error correction block 230 is coupled to the flash ADC F1 206*a*, flash ADC F2 206*b* to flash ADC Fn 206*n*. The estimator block 236 is coupled to the digital error correction block 230. The corrector block 244 is coupled to both the estimator block 236 and the digital error correction block 230. The pipeline ADC 200 may include one or more additional components known to those skilled in the relevant art and are not discussed here for simplicity of the description.

The operation of the pipeline ADC 200 is explained now. The operation is explained in reference to stage 204*a* and 204*b* and it is understood that other stages operate analogously. The stage 204*a* receives the input signal IP 202. The flash ADC F1 206*a* in the stage 204*a* generates a flash output 208*a* in response to the input signal IP 202. The DAC1 210*a* generates a coarse signal 212*a* in response to the flash output 208*a*. The subtractor 216*a* generates a residue signal 220*a* by subtracting the coarse signal 212*a* from the input signal IP 202. The gain amplifier G1 222*a* amplifies the residue signal 220*a* to generate an amplified signal 224*a*.

The stage 204*b* receives the amplified signal 224*a*. The flash ADC F2 206*b* in the stage 204*b* generates a flash output 208*b* in response to the amplified signal 224*a*. The DAC2 210*b* generates a coarse signal 212*b* in response to the flash output 208*b*. A subtractor 216*b* generates a residue signal 220*b* by subtracting the coarse signal 212*b* from the amplified signal 224*a*. The gain amplifier G2 222*b* amplifies the residue signal 220*b* to generate an amplified signal 224*b*.

At least one of the flash ADC, flash ADC F1 206, flash ADC F2 206*b* to flash ADC Fn 206*n*, includes one or more stochastic comparators. The stochastic comparator is analogous to the stochastic comparator 100, discussed with reference to FIG. 1, in connection and operation. The stochastic comparator, similar to stochastic comparator 100, includes a first comparator, a second comparator, a decision block and a XOR gate. The first comparator compares the input signal IP 202 and a primary threshold to generate a first signal. The second comparator compares the input signal IP 202 and the primary threshold to generate a second signal. The decision block generates a control signal in response to the first signal, the second signal and a PRBS (pseudo random binary sequence) signal. The XOR gate generates a detection signal in response to the first signal and the second signal.

The digital error correction block 230 receive the flash outputs 208*a*, 208*b* to 208*n* from flash ADC F1 206*a*, flash ADC F2 206*b* to flash ADC Fn 206*n* respectively. The digital error correction block 230 generates a granular signal 234 in response to the flash output received from each flash ADC. The granular signal 234 includes a vestigial output and a digital code. In one example, when the pipeline ADC 200 includes n stages, the digital code is obtained from stage 1 to stage n while the vestigial output is obtained from stage 2 to stage n.

The estimator block 236 is activated when the detection signal generated by at least one of the XOR gate is at logic high. The estimator block 236 correlates the vestigial output and an output of the stochastic comparator to generate a correction signal 240. The correction signal 240 includes a gain correction signal and a memory correction signal.

Multiple samples of vestigial output, which is part of the granular signal 234 generated by the digital error correction block 230, are collected by the estimator block 236 and represented as:

$$D[n] = G\left[X[n] - S\sum_{i=0, i \neq k}^{N-1} C_i[n] + SP[n]\right] \quad (1)$$

where, k represents the stochastic comparator, Ci represents comparator decision, S denotes DAC step and P[n] denotes a control signal generated by the stochastic comparator, N denotes the number of comparators in the Flash ADC, n denotes the time index, G denotes gain of the gain amplifier of a current stage and X(n) denotes the vestigial output from previous stage.

The estimator block 236 collects these samples of vestigial output only when the detection signal generated by the XOR gate is at logic high. The estimator block 236 correlates D[n] with P[n] to obtain the gain of the gain amplifier of the current stage, represented as:

$$\hat{G} = \frac{1}{S*M} \sum_{i=0}^{M-1} D[i]P[i] \quad (2)$$

where, M is a number of samples.

Also, the estimator block 236 collects multiple sample of vestigial output when a current and a previous value of detection signal is logic high. These samples are represented as:

$$D_m[n] = G\left[X[n] - S \sum_{i=0, i \neq k}^{N-1} C_i[n] + SP[n]\right] + \quad (3)$$

$$m\left[X[n-1] - S \sum_{i=0, i \neq k}^{N-1} C_i[n-1] + SP[n-1]\right]$$

where, m denotes memory error. The estimator block 236 correlates $D_m[n]$ with $P[n-1]$ to generate the memory correction signal represented as:

$$\hat{m} = \frac{1}{S*M} \sum_{i=0}^{M-1} D_m[i]P[i-1] \quad (4)$$

where, M is a number of samples.

The gain correction signal and the memory correction signal are both provided as part of the correction signal 240 to the corrector block 244. The corrector block 244 corrects the digital code based on the correction signal 240 to generate a fine signal 250.

The pipeline ADC 200 effectively addresses the incorrect gain and memory problem. In one example, the estimator block 236 continues to estimate the gain correction signal and the memory correction signal in background. The pipeline ADC 200, in another example, also tracks variation in the gain and memory due to process, voltage and temperature variations. Also, the pipeline ADC 200 consumes less power since the loop is disabled when the detection signal generated by the XOR gate is at logic low.

Figure 3:
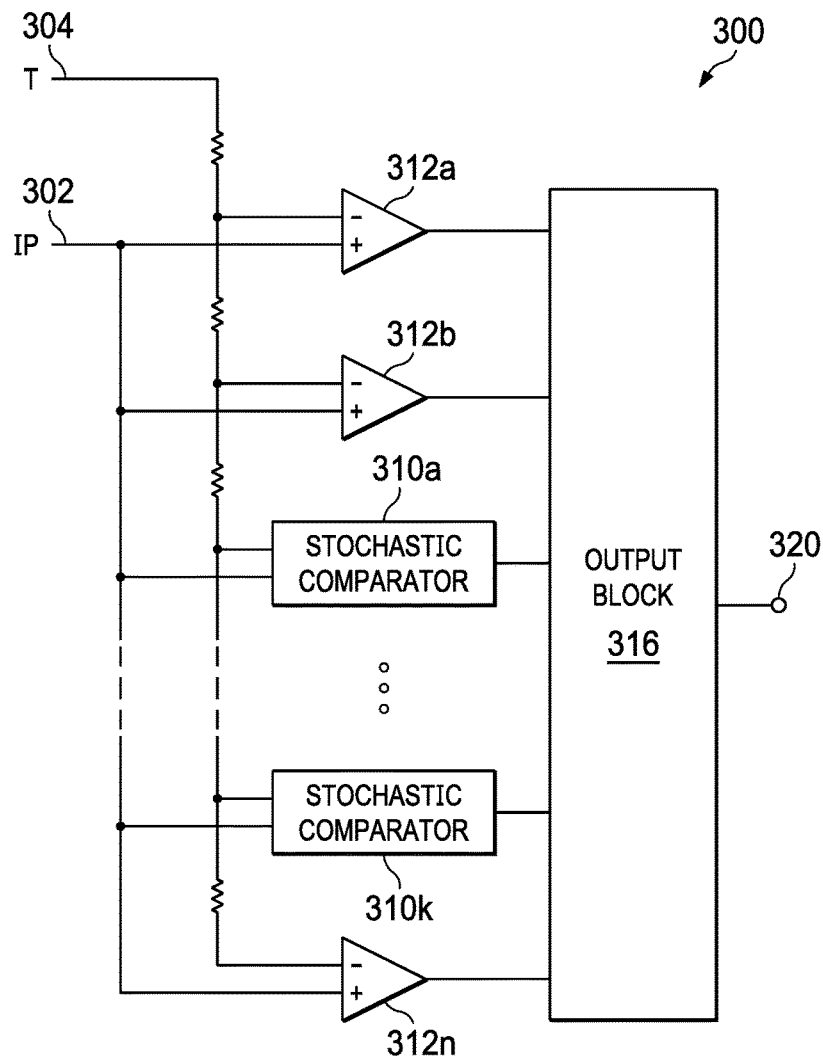
FIG. 3 illustrates a block diagram of a flash analog to digital converter (ADC), according to an embodiment.

FIG. 3 illustrates a block diagram of a flash analog to digital converter (ADC) 300, according to an embodiment. The flash ADC 300 is analogous in connection and operation to at least one flash ADC in the pipeline ADC 200 represented as F1 206a, F2 206b and Fn 206n. The flash ADC 300 includes one or more regular comparators for example 312a, 312b to 312n. The flash ADC 300 also includes one or more stochastic comparator illustrated as 310a to 310k. The flash ADC 300 also includes an output block 316. In one example, the flash ADC 300 includes one regular comparator and one stochastic comparator.

Each of the regular comparators illustrated as 312a, 312b to 312n and the stochastic comparator receive an input signal IP 302 and a primary reference T 304. The primary reference T 304 is divided by a resistor-divider network to generate a primary threshold for each of the regular comparator and stochastic comparator. The output block 316 is coupled to the one or more regular comparators 312a to 312n and to the one or more stochastic comparator 310a to 310k. Each of the stochastic comparator is similar in connection and operation to the stochastic comparator 100. Each stochastic comparator 310a to 310k, similar to stochastic comparator 100, includes a first comparator, a second comparator, a decision block and a XOR gate. The flash ADC 300 may include one or more additional components known to those skilled in the relevant art and are not discussed here for simplicity of the description.

Each of the regular comparator compares the input signal IP 302 and a primary threshold to generate a bit signal. Each of the stochastic comparator processes the input signal IP 302 and the primary threshold to generate a control signal and a detection signal. The output block 316 receives the bit signal from each of the regular comparators 312a to 312n and also receives the control signal and the detection signal from each of the stochastic comparators 310a to 310k. The output block 316 generates a flash output 320. The flash output 320 is provided to a digital to analog converter (DAC) analogously to the DAC illustrated in each stage of the pipeline ADC 200 illustrated in FIG. 2.

The flash ADC 300 when used in a pipeline ADC, similar to the pipeline ADC 200, results in power saving because this enables use of an inaccurate gain amplifier, which has reduced power consumption. The inaccurate gain is corrected using the above described methodology.

Figure 4:
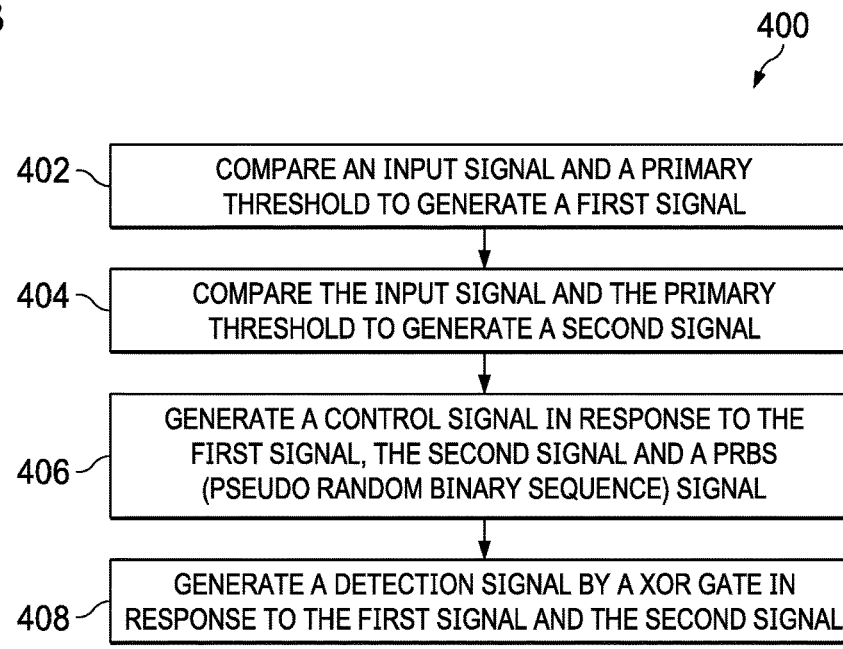
FIG. 4 is a flowchart to illustrate a method of operation of a circuit, according to an embodiment.

FIG. 4 is a flowchart 400 to illustrate a method of operation of a circuit, according to an embodiment. The flowchart 400 is explained in connection with the stochastic comparator 100 illustrated in FIG. 1. At step 402, an input signal is compared with a primary threshold to generate a first signal. At step 404, the input signal is compared with the primary threshold to generate a second signal. In stochastic comparator 100, for example, the first comparator 112 compares the input signal IP 102 and the primary threshold T 106 to generate a first signal 116. The second comparator 114 compares the input signal IP 102 and the primary threshold T 106 to generate a second signal 118.

At step 406, a control signal is generated in response to the first signal, the second signal and a PRBS (pseudo random binary sequence) signal. A XOR gate generates a detection signal in response to the first signal and the second signal, at step 408. In stochastic comparator 100, the decision block 120 generates a control signal C 124 in response to the first signal 116, the second signal 118 and the PRBS signal P 126. The XOR gate 130 generates a detection signal D 128 in response to the first signal 116 and the second signal 118.

When the first signal 116 and the second signal 118 are equal, the control signal C 124 is equal to one of the first signal 116 and the second signal 118. When the first signal 116 is 0 and the second signal 118 is 1 or vice-versa, the control signal C 124 is equal to the first signal 116 when the PRBS signal P 126 is equal to an ancillary bit, and the control signal C 124 is equal to the second signal 118 when the PRBS signal P 126 is equal to an inverse ancillary bit. A random mismatch between the first comparator 112 and the second comparator 114 and the thermal noise of these comparators results in non-equality of the first signal 116 and the second signal 118.

In one example, ancillary bit is 0 and the inverse ancillary bit is 1. Thus, when the first signal 116 and the second signal 118 are equal, the control signal C 124 is equal to one of the first signal 116 and the second signal 118. When the first signal 116 is 0 and the second signal 118 is 1 or vice-versa, then the control signal C 124 is equal to the first signal 116 when the PRBS signal P 126 is equal to 0, and the control signal C 124 is equal to the second signal 118 when the PRBS signal P 126 is equal to 1. The detection signal D 128 is at logic high or logic 1 when the first signal 116 is not equal to the second signal 118.

The method illustrated by flowchart 400 allows for use of an inaccurate amplifier in the ADC. The use of two comparators, the first comparator 112 and the second comparator 114, using the same primary threshold T 106 allows for indirect injection of a known signal, which provides an improved estimation of non-idealities associated with blocks following the first comparator 112 and the second comparator 114. In one example, when the input signal IP 102 is equal to or close to the primary threshold T 106, the control signal C 124 is equiprobable between the first signal 116 and the second signal 118. Hence, when the detection signal D 128, which is the output of the XOR gate 130, is equal to 1, the control signal C 124 acts as the known signal toggling between the ancillary bit and the inverse ancillary bit.

Figure 5:
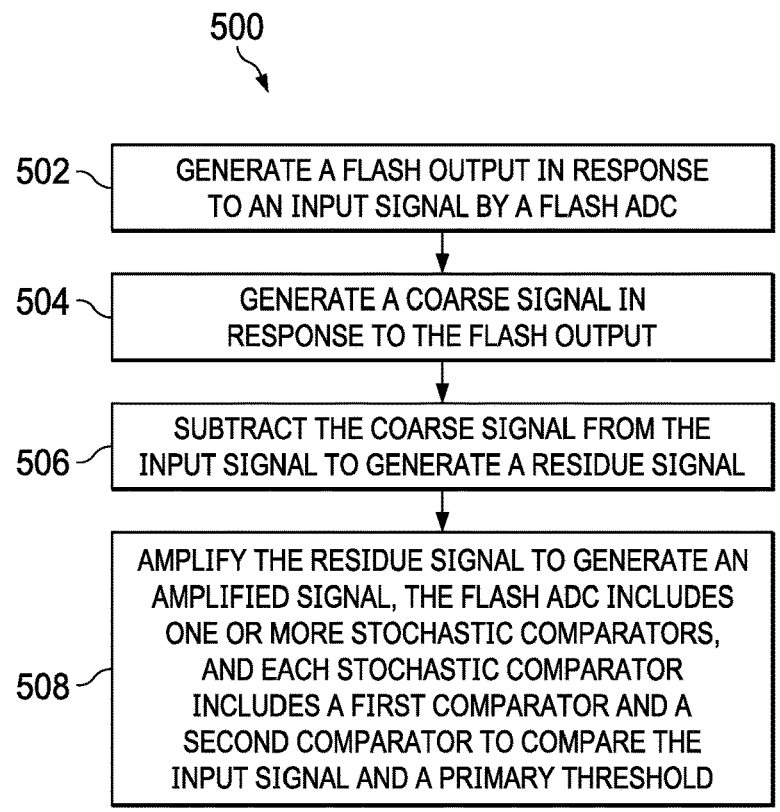
FIG. 5 is a flowchart to illustrate a method of operation of a circuit, according to another embodiment.

FIG. 5 is a flowchart 500 to illustrate a method of operation of a circuit, according to an embodiment. The flowchart 500 is explained in connection with the pipeline ADC (analog to digital converter) 200 illustrated in FIG. 2. At step 502, a flash output is generated in response to an input signal by a flash ADC. For example, the pipeline ADC 200 includes multiple stages 204a, 204b to 204n and each stage includes a flash ADC for example F1 206a, F2 206b and Fn 206n. The flash ADC F1 206a in the stage 204a generates a flash output 208a in response to the input signal IP 202.

A coarse signal is generated in response to the flash output, at step 504. The coarse signal is subtracted from the input signal to generate a residue signal, at step 506. Each stage of the pipeline ADC 200 also includes a DAC (digital to analog converter) for example the DAC1 210a, DAC2 210b and DACn 210n. Each stage also includes a subtractor coupled to the DAC for example DAC1 210a is coupled to a subtractor 216a, and DACn 210n is coupled to a subtractor 216n. The DAC1 210a generates a coarse signal 212a in response to the flash output 208a. The subtractor 216a generates a residue signal 220a by subtracting the coarse signal 212a from the input signal IP 202.

At step 508, the residue signal is amplified to generate an amplified signal. A gain amplifier is part of each stage in the pipeline ADC 200 for example G1 222a, G2 222b to Gn 222n. The gain amplifier G1 222a amplifies the residue signal 220a to generate an amplified signal 224a.

The flash ADC includes one or more stochastic comparators and each stochastic comparator includes a first comparator and a second comparator. Each of the first comparator and the second comparator compares the input signal and a primary threshold. In the pipeline ADC 200, at least one of the flash ADC, flash ADC F1 206, flash ADC F2 206b to flash ADC Fn 206n, includes one or more stochastic comparators. The stochastic comparator, similar to stochastic comparator 100, includes a first comparator, a second comparator, a decision block and a XOR gate. The first comparator compares the input signal IP 202 and a primary threshold to generate a first signal. The second comparator compares the input signal IP 202 and the primary threshold to generate a second signal. The decision block generates a control signal in response to the first signal, the second signal and a PRBS (pseudo random binary sequence) signal. The XOR gate generates a detection signal in response to the first signal and the second signal.

The method also includes generating a granular signal from the flash output received from a flash ADC of each stage of the plurality of stages. A correction signal is generated in response to the granular signal, the detection signal and an output of the stochastic comparator. A fine signal is generated in response to the correction signal and the granular signal. In FIG. 2, the pipeline ADC 200 also includes a digital error correction block 230, an estimator block 236 and a corrector block 244.

The digital error correction block 230 receives the flash outputs 208a, 208b to 208n from flash ADC F1 206a, flash ADC F2 206b to flash ADC Fn 206n respectively. The digital error correction block 230 generates a granular signal 234 in response to the flash output received from each flash ADC. The estimator block 236 is activated when the detection signal generated by the XOR gate is at logic high. The estimator block 236 correlates the granular signal and an output of the stochastic comparator to generate a correction signal 240. The corrector block 244 generate a fine signal 250 based on the correction signal 240 and the granular signal 234.

The method illustrated by flowchart 500 allows a pipeline ADC, similar to the pipeline ADC 200, to effectively address the incorrect gain and memory problem The method also provides tracking variation in the gain and memory due to process, voltage and temperature variations. Also, when the method is used by a pipeline ADC, it allows for less consumption of power since the loop is disabled when the detection signal generated by the XOR gate is at logic low.

Figure 6:
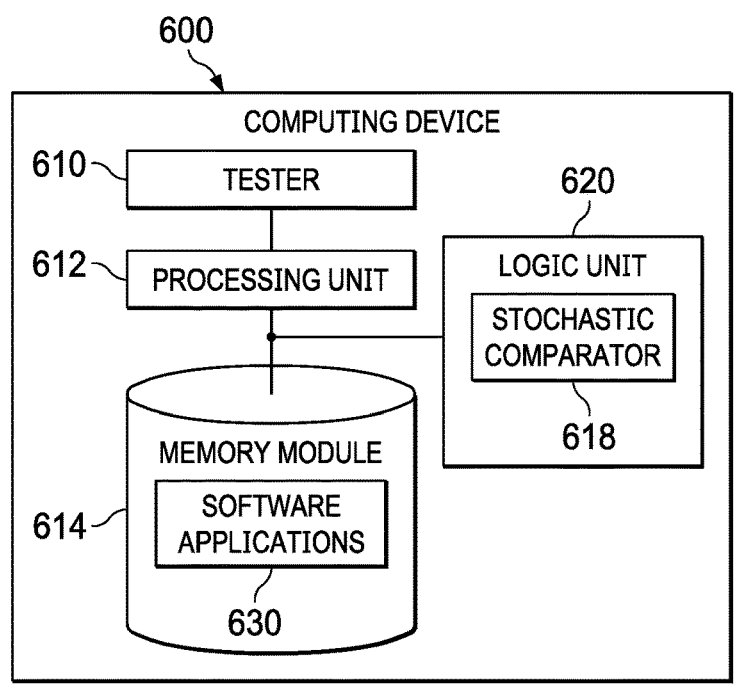
FIG. 6 illustrates a computing device, according to an embodiment.

FIG. 6 illustrates a computing device 600 according to an embodiment. The computing device 600 is, or is incorporated into, a mobile communication device, such as a mobile phone, a personal digital assistant, a personal computer, or any other type of electronic system. The computing device 600 may include one or more additional components known to those skilled in the relevant art and are not discussed here for simplicity of the description.

In some embodiments, the computing device 600 comprises a megacell or a system-on-chip (SoC) which includes a processing unit 612 such as a CPU (Central Processing Unit), a memory module 614 (e.g., random access memory (RAM)) and a tester 610. The processing unit 612 can be, for example, a CISC-type (Complex Instruction Set Computer) CPU, RISC-type CPU (Reduced Instruction Set Computer), or a digital signal processor (DSP).

The memory module 614 (which can be memory such as RAM, flash memory, or disk storage) stores one or more software applications 630 (e.g., embedded applications) that, when executed by the processing unit 612, perform any suitable function associated with the computing device 600. The tester 610 comprises logic that supports testing and debugging of the computing device 600 executing the software application 630.

For example, the tester 610 can be used to emulate a defective or unavailable component(s) of the computing device 600 to allow verification of how the component(s), were it actually present on the computing device 600, would perform in various situations (e.g., how the component(s) would interact with the software application 630). In this way, the software application 630 can be debugged in an environment which resembles post-production operation.

The processing unit 612 typically comprises a memory and logic which store information frequently accessed from the memory module 614. The computing device 600 includes a logic unit 620 coupled to the processing unit 612 and the memory module 614. The logic unit 620 includes a stochastic comparator 618. The stochastic comparator 618 is analogous to the stochastic comparator 100 in connection and operation.

The stochastic comparator 618 includes a first comparator, a second comparator, a decision block and a XOR gate. Each of the first comparator and the second comparator receive an input signal and a primary threshold. The decision block is coupled to the first comparator and the second comparator. The first comparator compares the input signal and the primary threshold to generate a first signal. The second comparator compares the input signal and the primary threshold to generate a second signal. The decision block generates a control signal in response to the first signal, the second signal and the PRBS signal. The XOR gate generates a detection signal in response to the first signal and the second signal. In one embodiment, the logic unit 420 includes a pipeline ADC, similar to the pipeline ADC 200, and the stochastic comparator 618 is part of the pipeline ADC.

The use of two comparators, the first comparator and the second comparator, using the same primary threshold allows for indirect injection of a known signal, which provides an improved estimation of non-idealities associated with blocks following the first comparator and the second comparator. In one example, when the input signal is equal to or close to the primary threshold, the control signal is equiprobable between the first signal and the second signal. Hence, when the detection signal, which is the output of the XOR gate, is equal to 1, the control signal acts as the known signal toggling between an ancillary bit and an inverse ancillary bit.

Modifications are possible in the described embodiments, and other embodiments are possible, within the scope of the claims.

What is claimed is:

1. A stochastic comparator comprising:
a first comparator configured to compare an input signal and a primary threshold to generate a first signal;
a second comparator configured to compare the input signal and the primary threshold to generate a second signal;
a decision block configured to generate a control signal in response to the first signal, the second signal and a PRBS (pseudo random binary sequence) signal; and
a XOR gate configured to generate a detection signal in response the first signal and the second signal.

2. The stochastic comparator of claim 1, wherein:
the control signal is equal to one of the first signal and the second signal when the first signal is equal to the second signal;
the control signal is equal to the first signal when the first signal is not equal to the second signal and the PRBS signal is equal to an ancillary bit; and
the control signal is equal to the second signal when the first signal is not equal to the second signal and the PRBS signal is equal to an inverse ancillary bit.

3. The stochastic comparator of claim 1, wherein the detection signal is at logic high when the first signal is not equal to the second signal.

4. The stochastic comparator of claim 1, wherein the PRBS signal comprises random sequence of binary bits.

5. A pipeline ADC (analog to digital converter) comprising a plurality of stages, and at least one stage comprising:
a flash ADC configured to receive an input signal and configured to generate a flash output;
a DAC (digital to analog converter) coupled to the flash ADC and configured to generate a coarse signal in response to the flash output;
a subtractor coupled to the DAC and configured to generate a residue signal in response to the coarse signal and the input signal; and
a gain amplifier coupled to the subtractor and configured to generate an amplified signal in response to the residue signal, wherein the flash ADC includes one or more stochastic comparators, and each stochastic comparator comprises a first comparator and a second comparator configured to compare the input signal and a primary threshold.

6. The pipeline ADC of claim 5, wherein in the stochastic comparator:
the first comparator compares the input signal and the primary threshold to generate a first signal; and
the second comparator compares the input signal and the primary threshold to generate a second signal.

7. The pipeline ADC of claim 6, wherein the stochastic comparator further comprises:
a decision block configured to generate a control signal in response to the first signal, the second signal and a PRBS (pseudo random binary sequence) signal; and
a XOR gate configured to generate a detection signal in response the first signal and the second signal.

8. The pipeline ADC of claim 7 further comprising:
a digital error correction block coupled to the flash ADC of each stage of the plurality of stages, the digital error correction block configured to receive a flash output from each flash ADC and configured to generate a granular signal;
an estimator block configured to generate a correction signal in response to the granular signal, the detection signal and an output of the stochastic comparator; and
a corrector block configured to generate a fine signal in response to the correction signal and the granular signal.

9. The pipeline ADC of claim 8, wherein the granular signal includes a vestigial output and a digital code.

10. The pipeline ADC of claim 9, wherein the estimator block is activated when the detection signal is at logic high, and correlates the vestigial output and an output of the stochastic comparator to generate the correction signal.

11. The pipeline ADC of claim 9, wherein the corrector block is configured to correct the digital code based on the correction signal to generate the fine signal.

12. The pipeline ADC of claim 5, wherein the flash ADC further comprises:
one or more regular comparators configured to compare the input signal and the primary threshold; and
an output block coupled to the one or more regular comparators and one or more stochastic comparators, the output block configured to generate the flash output.

13. A method comprising:
comparing an input signal and a primary threshold to generate a first signal;
comparing the input signal and the primary threshold to generate a second signal;
generating a control signal in response to the first signal, the second signal and a PRBS (pseudo random binary sequence) signal; and
generating a detection signal by a XOR gate in response to the first signal and the second signal.

14. The method of claim 13 further comprising:
generating one of the first signal and the second signal as the control signal when the first signal is equal to the second signal;
generating the first signal as the control signal when the first signal is not equal to the second signal and the PRBS signal is equal to an ancillary bit; and
generating the second signal as the control signal when the first signal is not equal to the second signal and the PRBS signal is equal to an inverse ancillary bit.

15. A method of gain error estimation in a pipeline ADC, the pipeline ADC comprising a plurality of stages, comprising:

generating a flash output in response to an input signal by a flash ADC;
generating a coarse signal in response to the flash output;
subtracting the coarse signal from the input signal to generate a residue signal; and
amplifying the residue signal to generate an amplified signal, wherein the flash ADC includes one or more stochastic comparators, and each stochastic comparator comprises a first comparator and a second comparator configured to compare the input signal and a primary threshold.

16. The method of claim 15 further comprising:
comparing the input signal and the primary threshold by the first comparator to generate a first signal; and
comparing the input signal and the primary threshold by the second comparator to generate a second signal.

17. The method of claim 16 further comprising:
generating a control signal in response to the first signal, the second signal and a PRBS (pseudo random binary sequence) signal; and
generating a detection signal by a XOR gate in response the first signal and the second signal.

18. The method of claim 17 further comprising:
generating a granular signal from the flash output received from the flash ADC of each stage of the plurality of stages;
generating a correction signal in response to the granular signal, the detection signal and an output of the stochastic comparator; and
generating a fine signal in response to the correction signal and the granular signal.

19. A computing device comprising:
a processing unit;
a memory module coupled to the processing unit; and
a logic unit coupled to the processing unit and the memory module, the logic unit comprising a stochastic comparator, the stochastic comparator comprising:
  a first comparator configured to compare an input signal and a primary threshold to generate a first signal;
  a second comparator configured to compare the input signal and the primary threshold to generate a second signal;
  a decision block configured to generate a control signal in response to the first signal, the second signal and a PRBS (pseudo random binary sequence) signal; and
  a XOR gate configured to generate a detection signal in response the first signal and the second signal.

20. The computing device of claim 19, wherein:
the control signal is equal to one of the first signal and the second signal when the first signal is equal to the second signal;
the control signal is equal to the first signal when the first signal is not equal to the second signal and the PRBS signal is equal to an ancillary bit; and
the control signal is equal to the second signal when the first signal is not equal to the second signal and the PRBS signal is equal to an inverse ancillary bit.

* * * * *